United States Patent
Derbyshire et al.

(10) Patent No.: US 7,409,200 B2
(45) Date of Patent: Aug. 5, 2008

(54) MODULE INTEGRATION INTEGRATED CIRCUITS

(75) Inventors: James H. Derbyshire, Ottawa (CA); Alan J. A. Trainor, Harlow (GB)

(73) Assignee: SiGe Semiconductor Inc., Ottawa, Ontario (CA)

(*) Notice: Subject to any disclaimer, the term of this patent is extended or adjusted under 35 U.S.C. 154(b) by 906 days.

(21) Appl. No.: 10/857,938

(22) Filed: Jun. 2, 2004

(65) Prior Publication Data

US 2005/0079851 A1    Apr. 14, 2005

Related U.S. Application Data

(63) Continuation-in-part of application No. 10/680,208, filed on Oct. 8, 2003.

(51) Int. Cl.
H04B 1/28 (2006.01)

(52) U.S. Cl. .................. 455/333; 455/339; 455/341; 333/246; 257/723

(58) Field of Classification Search .......... 257/723, 257/724, 784; 455/252.1, 323, 333, 334, 455/338, 339, 340, 341; 333/166, 185, 246, 333/260

See application file for complete search history.

(56) References Cited

U.S. PATENT DOCUMENTS

| | | | |
|---|---|---|---|
| 5,258,325 A | | 11/1993 | Spitzer et al. |
| 5,731,945 A | | 3/1998 | Bertin et al. |
| 5,844,853 A | | 12/1998 | Kitsukawa et al. |
| 5,983,089 A | * | 11/1999 | Mohwinkel et al. .......... 455/323 |
| 6,054,900 A | * | 4/2000 | Ishida et al. ................ 330/286 |
| 6,075,995 A | | 6/2000 | Jensen |
| 6,734,553 B2 | * | 5/2004 | Kimura ...................... 257/723 |
| 7,164,905 B2 | * | 1/2007 | Tamaki et al. ............... 455/403 |
| 7,245,884 B2 | * | 7/2007 | Oida et al. ................. 455/90.3 |
| 2001/0011926 A1 | | 8/2001 | Adar |
| 2003/0165052 A1 | | 9/2003 | Negishi et al. |

FOREIGN PATENT DOCUMENTS

| | | |
|---|---|---|
| EP | 0 436 074 A1 | 7/1991 |
| EP | 0 543 430 A2 | 5/2003 |
| EP | 1 385 305 A1 | 1/2004 |
| JP | 2001298123 | 10/2001 |
| WO | WO 96/13965 | 5/1996 |
| WO | WO 03/061174 A2 | 7/2003 |

OTHER PUBLICATIONS

Guckenberger et al., "Integrated DC-DC Converter Design for Improved WCDMA Power Amplifier Efficiency in SiGe BiCMOS Technology", Proceedings of the 2003 International Symposium on Low Power Electronics and Design ISLPED '03, Aug. 25-27, 2003, pp. 449-454.

(Continued)

*Primary Examiner*—Edward Urban
*Assistant Examiner*—Nhan T. Le
(74) *Attorney, Agent, or Firm*—Townsend and Townsend and Crew LLP

(57) ABSTRACT

A first signal conditioning circuit is formed from a first portion, a second portion and a third portion. Signal conditioning functions of each of these portions are facilitated by a predetermined type of integrated semiconductor die within which they are formed. Two different semiconductor dies are thus provided for facilitating integration of the first through third signal conditioning portions therein. Wire bonds are provided between the two different semiconductor dies in order to form circuit paths between the different first through third portions. The signal routing using between the two different semiconductor dies provides for completing of the first signal conditioning circuit having a first signal conditioning function. For example, circuits such as interstage matching circuits are disposed on a different semiconductor die than power amplifier circuits.

34 Claims, 6 Drawing Sheets

OTHER PUBLICATIONS

Diels et al., "Single Package Integration of RF Blocks for a.5 Ghz WLAN Application", IEEE Transactions on Advanced Packaging, vol. 24, No. 3, Aug. 2001, pp. 384-391.

Furst R: "With GaAs Mmics Towards Dual Band Front End Applications In Wireless Communication" European Microwave Conference. Conference Proceedings, vol. 2, Sep. 8, 1997, pp. 1289-1294, XP010253196.

USPTO, for U.S. Appl. No. 10/680,208, 1st Restriction Requirement mailed Sep. 13, 2006.

U.S. Appl. No. 10/680,208, response to 1st Restriction Requirement filed Oct. 12, 2006.

USPTO, for U.S. Appl. No. 10/680,208, 2nd Restriction Requirement mailed Apr. 5, 2007.

U.S. Appl. No. 10/680,208, response to 2nd Restriction Requirement filed May 3, 2007.

USPTO, for U.S. Appl. No. 10/680,208, 1st Office Action mailed Dec. 26, 2007.

* cited by examiner

MODULE INTEGRATION INTEGRATED CIRCUITS

This application is a continuation in part of U.S. patent application Ser. No. 10/680,208, filed on: Oct. 8, 2003.

FIELD OF THE INVENTION

The invention relates to the field of RF front-end circuits and more specifically to the field of multi-standard RF front-end circuits implemented in a small module size.

BACKGROUND OF THE INVENTION

Typically, manufacturers in the area of wireless products wish to implement radio media interface circuits into radio terminals, such as PCMCIA cards or dongles, which typically must operate within the context of two or more radio standards but in accordance with one standard at any one time. These radio standards are for example collectively referred to as the IEEE 802 standard, which is well known to those of skill in the art. This standard is typically divisible into a number of individual radio standards including one standard at 5.8 GHz, known as 802.11a, and another two standards at 2.45 GHz, known as 802.11b and 802.11 g.

In terms of these radio standards, manufacturers are often interested in building radio terminals that will be able to operate at 802.11a, b, and g standards, with only one particular standard being active at any one time. As a result, the manufacturers are interested in acquiring a front-end module that incorporates receive and transmission elements such as the low noise amplifiers (LNA), power amplifiers (PA), impedance matching components, and RF switches for all the standards that the terminal or card must deal with. Thus providing them with flexibility in their radio terminal designs.

Unfortunately, PAs and other components such as the LNA, are highly specialized components that have specifications that generally do not overlap with other radio frequency bands. Thus, a 5.8 GHz PA is generally not suitable for use 2.4 GHz PA. As a result, distinct components such as the LNAs and PAs are incorporated into the module in order to accommodate different radio standards. Moreover, many of the high performance RF components such as PAs and LNAs have a relatively low level of ancillary circuit integration. For example, voltage regulation circuits, temperature regulation circuits, control circuits and other circuits that are used for control and optimization of the operation of the PA are often not integrated into a same die with the PA but rather disposed as discrete components, on separate semiconductor substrates, within the module surrounding the PA die. It is well understood by most module designers that adding more components to the module increases cost, reduces yield and durability while resulting in an increase in module size. This effect is compounded when additional circuitry is used for each active RF component such as an RF switch, LNA, and PA.

Recent advances in SiGe BiCMOS technology have allowed for progressively higher levels of integration of high-performance RF components. For example, a high-performance 2.45 GHz PA for the 802.11b/g standard implemented in SiGe BICMOS technology can incorporate voltage and temperature regulation circuitry along with various power optimization and control schemes manifested in control circuitry. The benefit of such high levels of integration are well understood by the IC design community and include reduced module sizes, reduced cost, reduced assembly time, and increased yield and module longevity. Moreover, for PAs in particular, the robustness of the PA in tolerating of mismatch conditions to the antenna can be improved with voltage standing wave ratio (VSWR) sensing circuitry and PA output power sensing circuitry integrated into the PA chip. In this particular example, a determination of high VSWR might lead to the generation of a control signal to reduce power output and thereby protect one or more PA gain stages from over voltage conditions. Clearly, integration of this type of ancillary circuitry into the PA has the potential to increase PA performance and robustness with a minimum increase in the module size. In respect of LNAs, the integration of bias point control circuitry is important.

However, the usage of SiGe BiCMOS technology in the industry is currently limited. For example, for 5.8 GHz PAs, only a small number of manufacturers are utilizing SiGe for whereas several end users are utilizing GaAs or group III-V based technologies. The GaAs based technologies however offer more gain per stage and lower losses in the RF signal path at 5.8 GHz. GaAs based technology, however, is often unsuitable for the integration of ancillary circuits for use with the GaAs based RF component. Voltage regulation, for example, may not be integrated into the GaAs based PA due to the lack of suitable elementary devices within the GaAs based technology. Therefore, in the context of a module, the module designer is compelled to add those additional circuits, or dies, for supporting of the GaAs based components. As mentioned previously, the addition of more components causes a detriment to the module size and cost.

A need therefore exists to for providing a compact RF module that supports a number of RF standards. It is therefore an object of the invention to provide a compact RF module that overcomes the limitations of the prior art by facilitating integration of multiple circuit components into a same module in order to support a number of RF standards.

SUMMARY OF THE INVENTION

In accordance with the invention there is provided an electronic apparatus comprising: a first integrated circuit semiconductor die comprising; a first portion of a first signal conditioning circuit integrated within the first integrated circuit die and disposed along a first signal path; a second integrated circuit semiconductor die comprising: a second portion of the first signal conditioning circuit integrated within the second integrated circuit die and disposed along the first signal path for performing a first signal conditioning function along with the first portion of a first signal conditioning circuit for a signal propagating along the first signal path; and, a substrate for supporting the first and second integrated circuit semiconductor dies and for providing electrical connection to and from the first and second integrated circuit semiconductor dies.

In accordance with the invention there is provided a method of manufacturing a module comprising: providing a first signal conditioning circuit comprising a first portion and a second portion; implementing the first portion of the first signal conditioning circuit within a first semiconductor die; implementing the second portion of the first signal conditioning circuit within a second semiconductor die; bonding the first and second dies to a common substrate; and, forming electrical connections between the two dies to complete the first signal conditioning circuit from the first portion of the first signal conditioning circuit and the second portion of the first signal conditioning circuit.

In accordance with the invention there is provided an electronic apparatus comprising: a first integrated circuit semiconductor die comprising: a first portion of a first signal conditioning circuit integrated within the first integrated circuit die and disposed along a first signal path; a third portion of a first signal conditioning circuit integrated within the first integrated circuit die and disposed along the first signal path; a second integrated circuit semiconductor die comprising: a second portion of the first signal conditioning circuit integrated within the second integrated circuit die and disposed along the first signal path for performing a first signal conditioning function along with the first and third portions of the first signal conditioning circuit for a signal propagating along the first signal path; and, a substrate for supporting the first and second integrated circuit semiconductor dies and for providing electrical connection to and from the first and second integrated circuit semiconductor dies.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
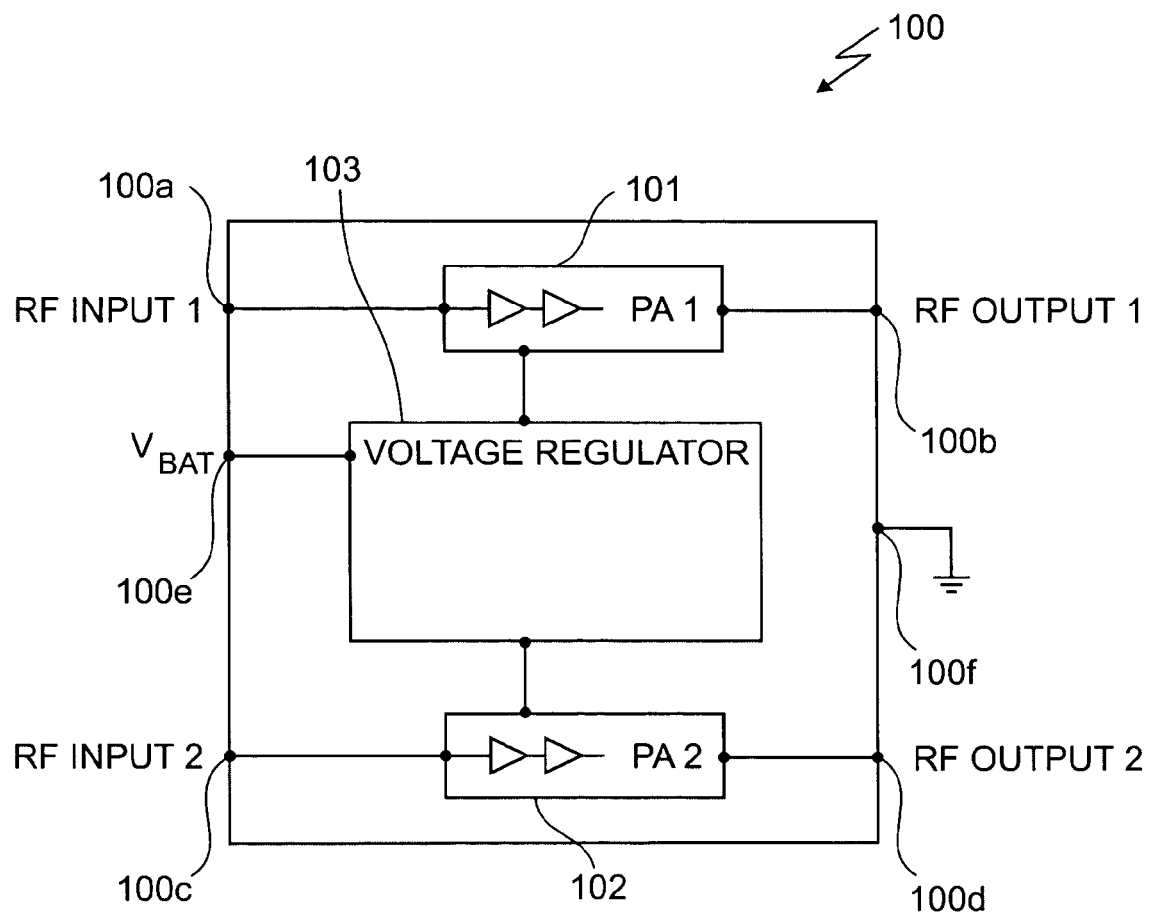
FIG. 1 illustrates a prior art integration of components into a module.

FIG. 1 illustrates a prior art integration of components into a module 100. Disposed within the module 100 is a first signal conditioning circuit 101, a second signal conditioning circuit 102 and a voltage regulator circuit 103. The first signal conditioning circuit is disposed between a first RF signal input port 100a and a first RF signal output port 10b. The second signal conditioning circuit is disposed between a second RF signal input port 100c and a second RF signal output port 100d. A regulated supply voltage is provided to both the first and second signal conditioning circuits from the regulator circuit 103, which is disposed on a different semiconductor substrate than the first and second signal conditioning circuits, 101 and 102. A supply voltage is provided to the regulator circuit 103 from a battery (not shown) through a positive supply voltage input port 100e and through a ground port 100f. The first and second signal conditioning circuits are also connected to the ground port 100f.

The voltage regulator circuit 103 is disposed as the third component of this module 100. Typically, the voltage regulation properties of the regulator circuit 103 are not optimized for operating with either the first or the second signal conditioning circuits in order to save on module cost 100. But, a trade-off in the module 100 specifications allows for the use of a single regulator circuit 103 for regulating the supply voltage to both signal conditioning circuits. Providing a separate voltage regulator for each signal conditioning circuit would unfortunately add another semiconductor substrate to the module 100 and result in an increased module cost.

For example, the module 100 shown in FIG. 1 is for use in cellular telephones, where two cellular band power amplifier circuits (PAs) are incorporated into the module as the first and second signal conditioning circuits, 101 and 102. In such a module, the voltage regulation circuit is typically silicon-based and disposed with power amplifier modules of two different types, such as GaAs based PAs. It is not uncommon to find that the module size is determined by the area required for the ancillary circuits, such as the voltage regulation circuit 103, rather than by the area required by core RF components, such as the PAs.

Referring to the prior art module illustrated in FIG. 1, all circuits included into the module are disposed as discrete components. Unfortunately, this leads to progressively larger and more expensive modules as functionality and performance are increased. A further disadvantage of the old technology lies in the additional assembly cost and additional assembly time associated with placing and wiring these numerous circuits and components within the module 100. It is well understood that in designing and manufacturing of the module, the area requirements grow in proportionality to the number of circuits and components used. Furthermore, the probability of manufacturing errors and defects increases in proportion to the number of circuits and components required in the design.

Figure 2:
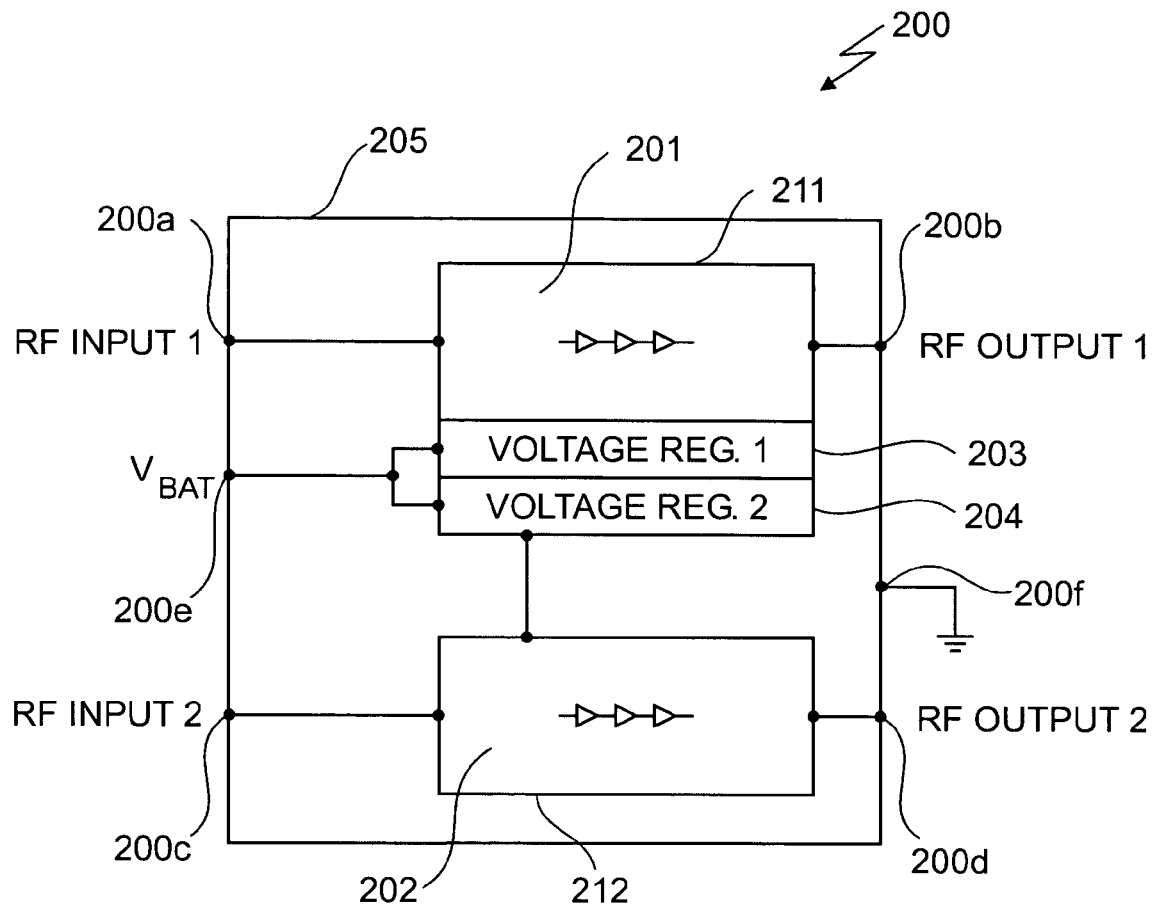
FIG. 2 illustrates a first embodiment of the invention, a module 200 having two semiconductor substrates integrated within the module, as opposed to three, as shown in FIG. 1.

FIG. 2 illustrates a first embodiment of the invention, a module 200 having two semiconductor substrates integrated within the module, as opposed to three, as shown in FIG. 1. A first signal conditioning circuit 201 is formed on a first semiconductor substrate 211 and a second signal conditioning circuit 202 is formed on a second semiconductor substrate 212. The first signal conditioning circuit 201 is disposed between a first RF signal input port 200a and a first RF signal output port 200b. The second signal conditioning circuit 202 is disposed between a second RF signal input port 200c and a second RF signal output port 200d.

In addition, a first ancillary circuit 203 and a second ancillary circuit 204 are disposed on the first semiconductor substrate 211. The first ancillary circuit 203, in the form of a first voltage regulator circuit, is for providing a first regulated supply voltage to the first signal conditioning circuit 201. The second ancillary circuit 203, in the form of a second voltage regulator circuit, is for providing a second regulated supply voltage to the second signal conditioning circuit 202. An unregulated supply voltage from a source (not shown) is provided to the first and second regulator circuits through a positive supply voltage terminal 200e and a ground terminal 200f. In this embodiment, the first and second voltage regulator circuits, 203 and 204, are integrated into the first semiconductor substrate 211, along with the first signal conditioning circuit 201. A first interface port 211a disposed on the first semiconductor die 211 and connected to the second ancillary circuit 204 connects the second ancillary circuit 204 to the second semiconductor die using a second interface port 212a. The second interface port 212a is connected to the second signal conditioning circuit 202. For example, the first signal conditioning circuit comprises an amplifying circuit, such as a PA circuit or a low noise amplifier (LNA) circuit.

The integration of circuit components into the module 200 provides for a first integrated circuit formed in a first semiconductor substrate 211 and manufactured using a first semiconductor process. Disposed within the first integrated circuit is the first signal conditioning circuit 201 for performing a first signal conditioning function and the first ancillary circuit 203 electrically coupled to the first signal conditioning circuit 201 only for use by the first signal conditioning circuit 201 during operation thereof. The second ancillary circuit 204 is for other than being used by the first signal conditioning circuit 201 during operation thereof. The second integrated circuit 202 is electrically coupled to the second ancillary circuit 204 and formed in the second semiconductor substrate 212 and co-packaged with the first integrated circuit 211 within the module 200. The second integrated circuit 202 operates in conjunction with the second ancillary circuit 204, via the connection between the first and second interface ports, 211a and 212a, for performing the second signal conditioning function. Optionally, the second signal conditioning function is a similar function to the function performed by the first signal conditioning circuit 201.

Advantageously, the integration of circuit functionality into one or more of the semiconductor substrates offers immediate benefit. Integration of these ancillary circuits into the same die area already occupied by one of the other core components is efficient in respect of die area usage. The integration into a module 200, as shown in FIG. 2, allows for integration of different signal conditioning circuits that do not have overlap in their RF bands. The first signal conditioning circuit 201 is for example integrated within the first semiconductor substrate 211 using SiGe BiCMOS technology, along with the first and second voltage regulator circuits, 203 and 204. The second signal conditioning circuit 202 is, for example, integrated into the semiconductor substrate 212 using a GaAs process. As a result of this integration, the completed module 200 accommodates different radio standards in a single package. For example, for a 5.8 GHz PA, the second signal conditioning circuit 202 is used and for a 2.45 GHz PA the first signal conditioning circuit is used 201.

Figure 3:
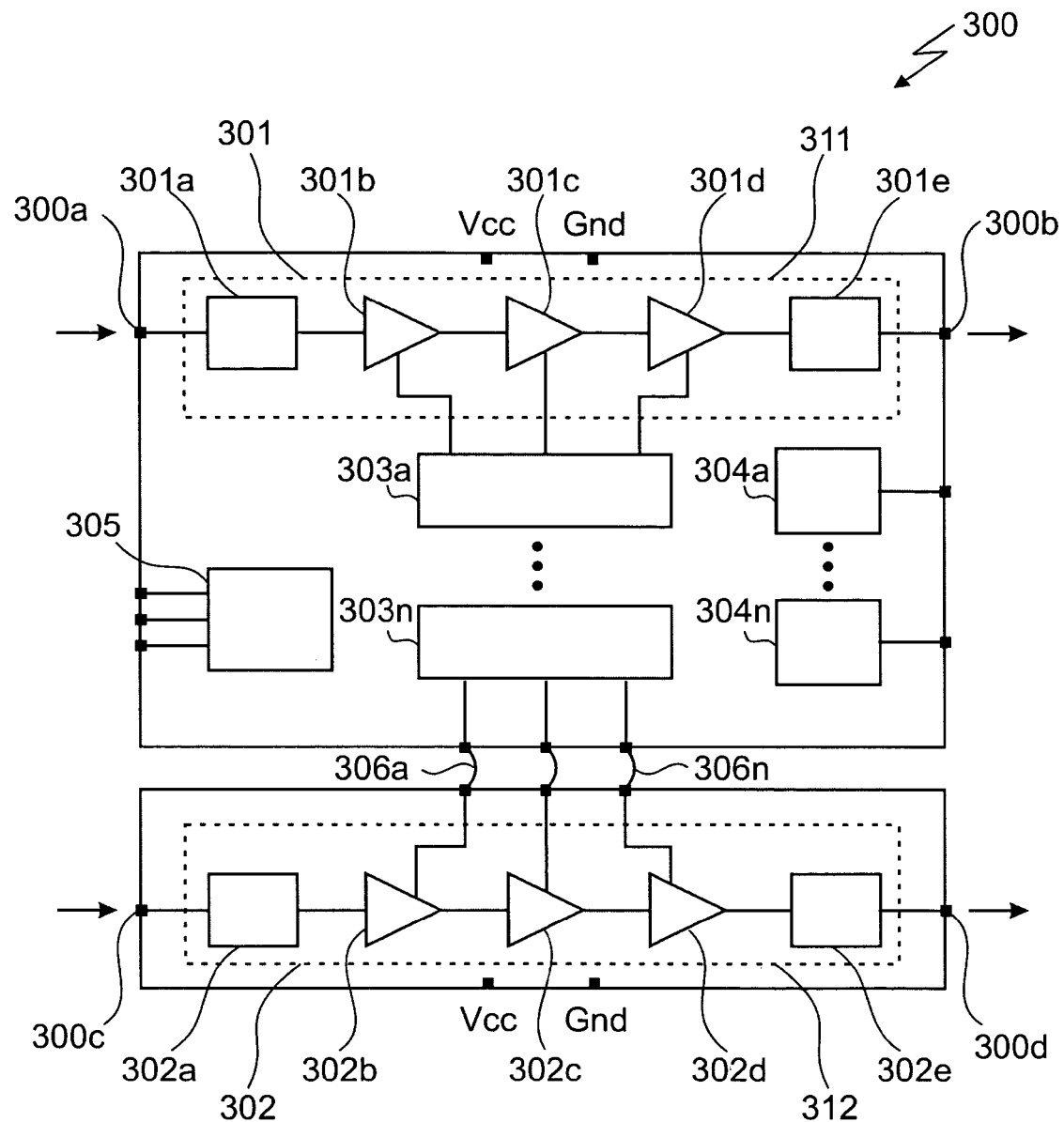
FIG. 3 illustrates a second embodiment of the invention, which illustrates a more specific implementation of the first embodiment of the invention.

FIG. 3 illustrates a second embodiment of the invention, which illustrates a more specific implementation of the first embodiment of the invention. Referring to FIG. 3, a module 300 having two semiconductor substrates, 311 and 312, integrated therein, is shown. A first signal conditioning circuit 301 is formed on a first semiconductor substrate 311 and a second signal conditioning circuit 302 is formed on a second semiconductor substrate 312. The first signal conditioning circuit 301 is disposed between a first RF signal input port 300a and a first RF signal output port 300b along a first signal path. The second signal conditioning circuit 302 is disposed between a second RF signal input port 300c and a second RF signal output port 300d along a second signal path.

A first plurality of ancillary circuitry 303a through 303n, in the form of a first plurality of control circuitry, is disposed within the first semiconductor substrate 311. At least one of the plurality 303n of ancillary circuitry, 303a through 303n, is unrelated to the operation of the first signal conditioning circuit 301 and used for accommodating the requirements of the second signal conditioning circuit 302 formed on the second semiconductor substrate 312. A plurality of electrical connections, 306a through 306n, —in the form of wire bonds, for example, is used for electrically coupling the at least one of the plurality 303n of ancillary circuitry to the second semiconductor substrate 312 for use by the second signal conditioning circuit 302. The plurality of electrical connections are disposed between a first plurality of interface ports disposed on the first semiconductor die and connected to the a least one of the plurality 303n of ancillary circuitry, 303a through 303n, and a second plurality of interface ports. The second plurality of interface ports are connected to the second signal conditioning circuit 302. The second signal conditioning circuit 302 is for performing a second signal conditioning function in conjunction with the a least one of the plurality 303n of ancillary circuitry, 303a through 303n, connected thereto.

The first signal conditioning circuit 301 is for performing a first signal conditioning function independent of the second signal conditioning circuit 302. As a result, RF signals propagating along the first signal path and the second signal path do not interfere with each other because the signal paths are separated on separate semiconductor dies.

Referring to the embodiment shown in FIG. 3, the first signal conditioning circuit comprises a first impedance transforming circuit 301a, in series with three amplification stages, 301b through 301d, and in series with a second impedance transforming circuit 301e. Disposed within the second signal conditioning circuit are a third impedance transforming circuit 302a, in series with three amplification stages, 302b through 302d, and in series with a second impedance transforming circuit 302e. Although the signal conditioning circuits are disposed on different semiconductor substrates, they perform similar functions. In this case, both signal conditioning circuits comprise PAs since they are used in RF amplification applications and as a result provide similar functions.

In addition, a plurality of power detector circuits 304a through 304n are also preferably integrated within the first semiconductor substrate 311. These power detector circuits are preferably used for detecting of RF output signal power being propagated from the first RF signal output port 300b and the second RF signal output port 300d. Other circuit blocks, such as circuit block 305, are also integrated within the first semiconductor substrate. Because the first semiconductor substrate is preferably manufactured using a process that supports a plurality of suitable elementary devices, such as SiGe BiCMOS, the integration of the first and second ancillary circuits is facilitated and serves to reduce space in the module without the addition of additional circuit components manufactured on additional semiconductor substrates, which causes a detriment to the module size and cost. Preferably, the semiconductor process that supports a larger scale of integration is utilized for integrating of a larger plurality of integrated circuit components therein.

Integration of a majority of ancillary circuit functionality into one or more of the semiconductor dies offers immediate benefit. Integration of these ancillary circuits into the same die area used by one of the core components is very efficient in respect of area usage within the module. The integration into a module, as shown in FIG. 2 and FIG. 3, allows for integration of different signal conditioning circuits into a same module that do not have overlap in their RF bands.

Optionally, a carrier platform, element 205 shown in FIG. 2, is used for supporting the various semiconductor dies, 211 and 212, and optionally other electrical components. The carrier platform 205 is for example a multi-layer laminate or even a silicon-based platform. The function of the carrier platform 205 is to support the semiconductor dies and to provide a means of interconnecting the electrical signals and power supply rails for each semiconductor die, 211 and 212. The embodiments of the invention are applicable for use in modules and other types of sub-assemblies where more than one component is co-located. Co-location referring to the disposition of the module components in close enough proximity such that PCB traces, wirebonds or other technologies are used to interconnect the components to each other. Often the components are in close enough proximity that wirebonding from one semiconductor die to another is sufficient. Thus, these semiconductor dies, 211 and 212, are placed onto the carrier platform 205 and wirebonded or flip-chipped to establish an electrical connection to interconnect traces forming part of the carrier platform 205. Typically, after placement of semiconductor dies and upon completion of wiring therebetween a mold compound is applied to finish the module.

Advantageously, only one of the semiconductor substrates within the module are designed to incorporate all the additional regulation and optimization circuitry required by the other signal conditioning circuits in the form of active RF components. In this manner, die area within the module is minimized, and thereby cost, and the number of components that require circuit connections therebetween is minimized. Furthermore, selection of active RF components on the basis of RF performance is greatly facilitated without placing additional regulation and additional optimization circuits for the greater performing RF components.

Disposing the first and second signal conditioning circuits on separate substrates advantageously eliminates crosstalk issues therebetween. Thus, output signal noise is minimized. Prior to designing of a module, a module designer of skill in the art determines which signal conditioning circuits will pose problems when integrated on a same semiconductor die and as such those circuits are integrated on separate dies.

Figure 4:
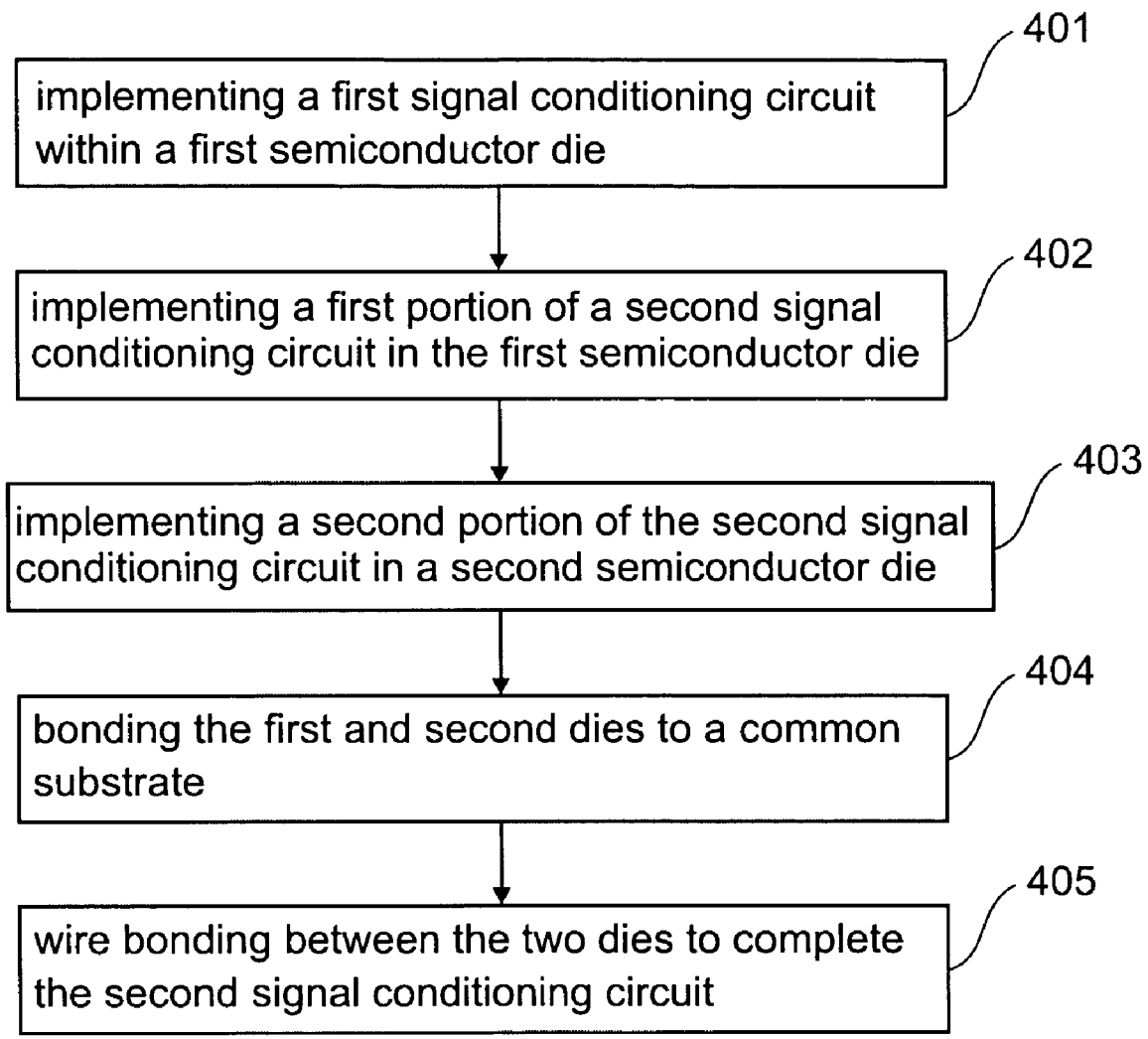
FIG. 4 illustrates the method of manufacturing a circuit in accordance in accordance with an embodiment of the present invention; and, FIG. 5 illustrates a third embodiment of the invention, a module 500 having two semiconductor substrates integrated within the module.

FIG. 4 illustrates a method steps for manufacturing a circuit for reducing crosstalk therein. A first signal conditioning circuit is implemented within a first semiconductor die, in step 401. A first portion of a second signal conditioning circuit is implemented in the first semiconductor die, in step 402. Referring to step 403, a second portion of the second signal conditioning circuit is implemented in a second semiconductor die. Thereafter, in step 404, the first and second dies are bonded to a common substrate, and in step 405, wire bonding between the two dies is performed to complete the second signal conditioning circuit.

Figure 5:
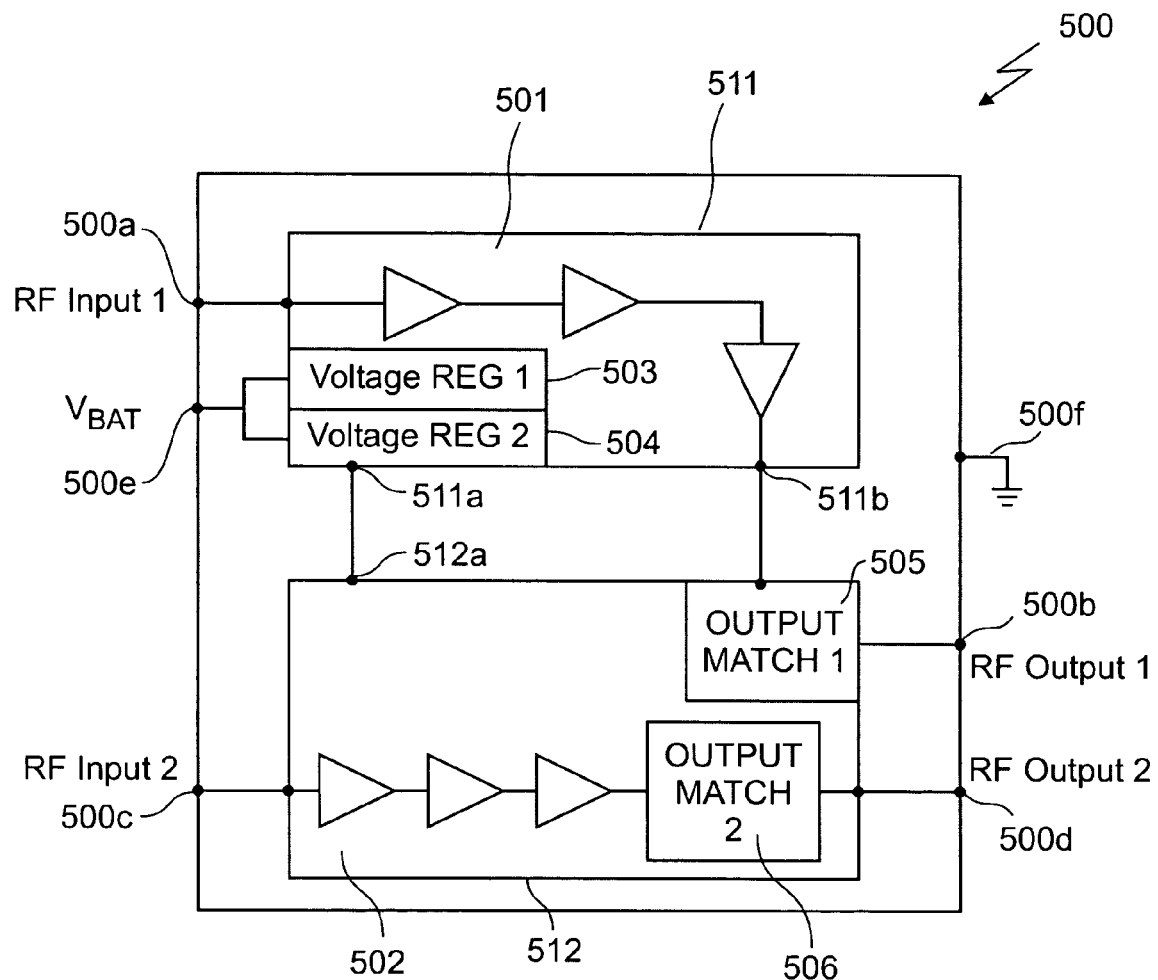

FIG. 5 illustrates a third embodiment of the invention, a module 500 having two semiconductor substrates, 511 and 512, integrated within the module. A first portion of a first signal conditioning circuit 501 and first and second ancillary circuits, 503 and 504, are integrated on a first semiconductor substrate 511 and a second portion of the first signal conditioning circuit 505 as well as first and second portions of the second signal conditioning circuit, 502 and 506, are integrated on a second semiconductor substrate 512. The first portion of the first signal conditioning circuit 501 is disposed between a first RF signal input port 500a and a first semiconductor substrate output port 511b, where the second portion of the first signal conditioning circuit 505 is coupled between the first semiconductor substrate output port 511b and a first RF signal output port 500b. The first portion of the second signal conditioning circuit 502 and the second portion of the second signal conditioning circuit 506 are disposed in series between a second RF signal input port 500c and a second RF signal output port 500d.

The first ancillary circuit 503, in the form of a first voltage regulator circuit, is for providing a first regulated supply voltage to the first portion of the first signal conditioning circuit 501. The second ancillary circuit 504, in the form of a second voltage regulator circuit, is for providing a second regulated supply voltage to the second portion of the first signal conditioning circuit 505 and to the first and second portions of the second signal conditioning circuit, 502 and 506. An unregulated supply voltage from a source (not shown) is provided to the first and second regulator circuits through a positive supply voltage terminal 500e and a ground terminal 500f.

The integration of circuit components into the module 500 provides for a first integrated circuit formed in a first semiconductor substrate 511 and manufactured using a first semiconductor process. Disposed within the first integrated circuit is the first portion of the first signal conditioning circuit 501 for performing a first signal conditioning function in conjunction with the second portion of the first signal conditioning circuit 505 and the first and second ancillary circuits 503 and 504 electrically coupled to the first and second portions of the first signal conditioning circuit, 501 and 505, respectively. The second ancillary circuit 504 is for other than being used by the first portion of the first signal conditioning circuit 501 during operation thereof. The second integrated circuit 502 includes the first portion of the second signal conditioning circuit 502 and the second portions of the first and second signal conditioning circuits, 505 and 506, where these portions operate using the electrically coupled second ancillary circuit 504 formed in the first semiconductor substrate 511 and co-packaged with the first integrated circuit 511 within the module 500.

The second integrated circuit 502 operates in conjunction with the second ancillary circuit 504, via a connection between the first and second interface ports, 511a and 512a. Optionally, the second signal conditioning function is a similar function to the function performed by the first signal conditioning circuit 501.

For example, the first semiconductor substrate 511 is a SiGe semiconductor substrate and the first signal conditioning circuit 501 and 505 is a PA circuit, which is known to have high loss, or low quality factor, when integrated on the silicon wafer. It is well known to those of skill in the art that inductors disposed on the silicon substrate suffer performance degradation due to absorption of RF energy within the substrate and other factors, as compared to inductors that are integrated on a semi-insulating GaAs substrate. Thus, for example, the second semiconductor substrate 512 is a GaAs substrate, where low-loss passive devices are integrated therein for use by the second portion of the first signal conditioning circuit 501. For example, the second portion of the first signal conditioning circuit 505 is an impedance matching circuit, for use with the first portion of the first signal conditioning circuit 501 in the form of a 2.4 GHz SiGe-based PA. The first portion of the second signal conditioning circuit is for example in the form of a 5 GHz PA.

Advantageously, this integration scheme provides a module designer with the best attributes of both semiconductor substrates, which in this case are silicon and GaAs, in order to achieve a high level of performance, and integration, with a low number of module components. Of course, other components, such as transmission lines, capacitors, and inductors for use by the SiGe-based die, are integrated within the second semiconductor substrate in order to provide increased operating efficiency.

Advantageously, the integration of circuit functionality into one or more of the semiconductor substrates offers immediate benefit. Integration of these ancillary circuits into the same die area already occupied by one of the other core components is efficient in respect of die area usage. The integration into a module 200, 500, as shown in FIGS. 2 and 5, allows for integration of different signal conditioning circuits that do not have overlap in their RF bands. The first signal conditioning circuit 201 and, 501 and 505, is for example integrated within the first semiconductor substrate 211, 511 using SiGe BiCMOS technology, along with the first and second voltage regulator circuits, 203 and 204, and 503 and 504. The second signal conditioning circuit 202, 502 and 506, for example, is integrated into the semiconductor substrate 212, 512 using a GaAs process. As a result of this integration, the completed module 200, 500 accommodates different radio standards in a single package. For example, for a 5.8 GHz PA, the second signal conditioning circuit 202, 502 and 506 is used for the 5.8 GHz PA and for a 2.45 GHz PA the first signal conditioning circuit 201, 501 and 505 is used.

Figure 6:
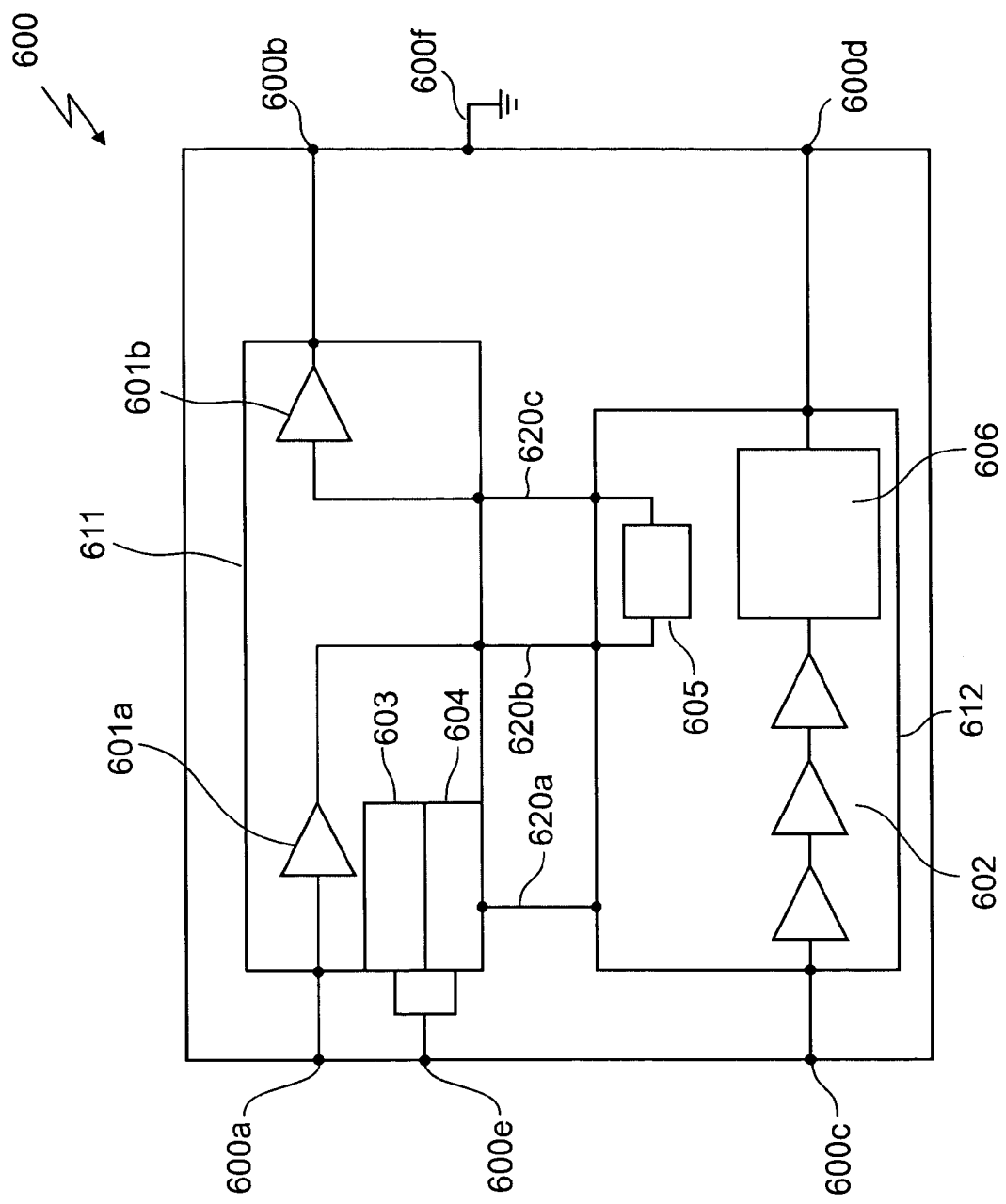
FIG. 6 illustrates a fourth embodiment of the invention, a module 600 having first and second integrated circuit semiconductor dies, 611 and 612, integrated within the module 600.

FIG. 6 illustrates a fourth embodiment of the invention, a module 600 having first and second integrated circuit semiconductor dies, 611 and 612, integrated within the module 600. A first portion of a first signal conditioning circuit 601a, a third portion of the first signal conditioning circuit 601b and first and second ancillary circuits, 603 and 604, are integrated within the first integrated circuit semiconductor die 611. A second portion of the first signal conditioning circuit 605 as well as first and second portions of the second signal conditioning circuit, 602 and 606, are integrated on the second integrated circuit semiconductor die 612.

The first portion of the first signal conditioning circuit 601a is disposed between a first RF signal input port 600a and an electrical connection 620b that connects an output port of the first portion of the first signal conditioning circuit 601a to a second portion of the first signal conditioning circuit 605 disposed in the second integrated circuit semiconductor die 612. An input port of the third portion of the first signal conditioning circuit 601b is coupled to an output port of the second portion of the first signal conditioning circuit 605 using an electrical connection 602c, where an output port of the third portion of the first signal conditioning circuit 601b forms an RF signal output port 600b. Thus, a first signal path is formed from the first RF signal input port 600a through to the first RF signal output port 600b.

A first portion of a second signal conditioning circuit 602 and the second portion of the second signal conditioning circuit 606 are disposed in series between a second RF signal input port 600c and a second RF signal output port 600d. A first ancillary circuit 603, in the form of a first voltage regulator circuit, is for providing a first regulated supply voltage to the first portion and third portions of the first signal conditioning circuit, 601a and 601b. The second ancillary circuit 604, in the form of a second voltage regulator circuit, is for providing a second regulated supply voltage to the second portion of the first signal conditioning circuit 605 and to the first and second portions of the second signal conditioning circuit, 602 and 606, through an electrical connection 620a. An unregulated supply voltage from a source (not shown) is provided to the first and second regulator circuits through a positive supply voltage terminal 600e and a ground terminal 600f.

The function of the first signal conditioning circuit, 601a, 605 and 601b, is to provide a first signal conditioning function utilizing the portions thereof disposed in the first and second integrated circuit semiconductor dies, 611 and 612. Preferably, the second portion of the first signal conditioning circuit 605 is an interstage matching circuit for performing an impedance match between the first and third portions, 601a and 601b, which are preferably in the form of power amplifier circuits. Thus, for example, if the first integrated circuit semiconductor die 611 includes silicon and the second integrated circuit semiconductor die 612 includes GaAs, then a signal propagating from the first portion 601a leaves the first semiconductor substrate 611, using electrical connection 620b, for interstage matching using the second portion 605. Thereafter, once the signal has been interstage matched, the signal leaves the second integrated circuit semiconductor die 612 and is propagated along using electrical connection 620c to the first integrated circuit semiconductor die 611, where it is received by an input port of the third portion 601b.

Optionally, the second portion of the first signal conditioning circuit 605 is coupled to the RF input port 600a for receiving of the RF input signal directly and serves to provide an impedance match between the input port and the third portion of the first signal conditioning circuit 601b.

Advantageously, the integration of the second portion of the first signal conditioning circuit 605 within the second integrated circuit semiconductor die 612 allows for signal conditioning operations that are more easily, or more cost effectively, facilitated by devices manufactured within the second integrated circuit semiconductor die 612 to be performed by circuitry integrated within the second integrated circuit semiconductor die for a signal propagating along the first signal path. Furthermore, those devices that allow for signal conditioning operations that are more easily, or more cost effectively, facilitated by devices manufactured within the first integrated circuit semiconductor die 611 to be performed by circuitry disposed within the first integrated circuit semiconductor die 611 for the signal propagating along the first signal path.

When the module design is performed, the signal conditioning circuit and ancillary circuits are integrated on the semiconductor dies in such a manner that the area of the die is minimized and other issues, such as noise and cornstalk, are also reduced. In the prior art, different signal conditioning and ancillary circuits are often disposed within the modules without foresight given to a reduction in module area and minimization of individual semiconductor die usage. Typically many different semiconductors dies are disposed within the module on the substrate, which unfortunately increases the manufacturing costs and does not result in a compact module size. Additionally, using some semiconductor manufacturing technologies is more costly for implementing of certain ancillary circuitry. For example, GaN and InP technologies have much larger costs associated with die are usage than silicon-based technologies. As a result, implementing an ancillary circuit in InP or GaN becomes significantly more expensive than implementing the functionally similar ancillary circuit in a silicon based technology.

Though the embodiments of the invention refer to two or more signal conditioning circuits such as power amplifiers, it well understood and appreciated in the art that the efficient provision of ancillary circuits necessary or beneficial to the operation of other types of circuits is enabled using this invention. For example, other signal conditioning circuits, such as memory buffers are envisioned for use exclusively by a separate PLL-type circuit and die. In the context of a module, this invention is very useful because it obviates the placement of some additional dies within. It does, however, require that the IC designer and module designer work with an overall view of the module objectives and the requirements of the various functional circuits in the module. With this invention and the realization that some ancillary circuits will be integrated into the same semiconductor die area as the signal conditioning circuits unrelated to those ancillary circuits, the partitioning of signal conditioning circuits and the ancillary circuits becomes an optimization task.

Though the above embodiments refer to a SiGe BiCMOS manufacturing technology, other suitable manufacturing technologies for integration of the ancillary circuitry is also supported according to the invention.

The embodiments of the invention further advantageously allow for integration of silicon-based technologies with other technologies such as GaAs, InP, and GaN that do not support a similar level of component integration.

Numerous other embodiments may be envisaged without departing from the spirit or scope of the invention.

What is claimed is:

1. An electronic apparatus comprising:
a first integrated circuit semiconductor die comprising:
a first portion of a first signal conditioning circuit integrated within the first integrated circuit die and disposed along a first signal path; and
a second integrated circuit semiconductor die comprising;
a second portion of the first signal conditioning circuit integrated within the second integrated circuit die and disposed along the first signal path for performing a first signal conditioning function along with the first portion of a first signal conditioning circuit for a signal propagating along the first signal path; and,
a substrate for supporting the first and second integrated circuit semiconductor dies and for providing electrical connection to and from the first and second integrated circuit semiconductor dies.

2. An electronic apparatus according to claim 1, comprising a second signal conditioning circuit comprising a first portion of the second signal conditioning circuit and a second portion of the second signal conditioning circuit integrated within the second integrated circuit die for performing a second signal conditioning function on a signal propagating along a second signal path that is different than the first signal path.

3. An electronic apparatus according to claim 2, wherein the first signal conditioning function and the second signal conditioning function provide similar signal conditioning functions.

4. An electronic apparatus according to claim 1, wherein the first integrated circuit die is manufactured using a first semiconductor process and utilizes a silicon based technology.

5. An electronic apparatus according to claim 4, wherein the second integrated circuit die is manufactured using a second semiconductor process and utilizes other than a silicon based technology.

6. An electronic apparatus according to claim 1, wherein the first portion of the first signal conditioning circuit comprises at least a power amplifier circuit and where the function of the first portion of the first signal conditioning circuit is for amplifying of an input signal using the at least a power amplifier circuit.

7. An electronic apparatus according to claim 6, wherein the second portion of the first signal conditioning circuit comprises an impedance matching circuit.

8. An electronic apparatus according to claim 2, wherein the second signal conditioning circuit comprises at least a power amplifier circuit and where the function of the first portion of the second signal conditioning circuit is for amplifying of an input signal using the at least a power amplifier circuit.

9. An electronic apparatus according to claim 8, wherein the second portion of the second signal conditioning circuit comprises an impedance matching circuit and where the function of the first portion of the second signal conditioning circuit is for amplifying of an input signal using the at least a power amplifier circuit.

10. An electronic apparatus according to claim 2, wherein the first semiconductor process does not facilitate manufacturing and integration of at least one of the second portion of the first signal conditioning circuit and the second portion of the second signal conditioning circuit.

11. An electronic apparatus according to claim 1, wherein the second integrated circuit die is manufactured using a second semiconductor process that is different from that used to manufacture the first integrated circuit die.

12. An electronic apparatus according to claim 1, wherein the first integrated circuit die is derived from a first semiconductor wafer comprised of one of Si, SiGe, GaAs, InP, and GaN.

13. An electronic apparatus according to claim 12, wherein the second integrated circuit die is derived from a second semiconductor wafer that is comprised of other one of Si, SiGe, GaAs, InP, and GaN.

14. An electronic apparatus according to claim 1, wherein the first integrated circuit die is manufactured using a BiCMOS process.

15. An electronic apparatus according to claim 1, wherein the second portion of the first signal conditioning circuit comprises at least one of a capacitor and an inductors and a signal transmission line.

16. An electronic apparatus according to claim 2, comprising: a first ancillary circuit integrated within the first integrated circuit die and electrically coupled to the first portion of the first signal conditioning circuit for use during operation thereof.

17. An electronic apparatus according to claim 16, comprising a second ancillary circuit integrated within the first integrated circuit semiconductor die and electrically coupled to the second portion of the first signal conditioning circuit and to the first and second portions of the second signal conditioning circuit for other than performing the first or the second signal conditioning function and for use by the second portion of the first signal conditioning circuit and the first and second portions of the second signal conditioning circuit during operation thereof.

18. A method of manufacturing a module comprising:
providing a first signal conditioning circuit comprising a first portion and a second portion;
providing a second signal conditioning circuit comprising a first portion and a second portion;
implementing the first portion of the first signal conditioning circuit within a first semiconductor die;
implementing the second portion of the first signal conditioning circuit within a second semiconductor die;
implementing the first and second portions of the second signal conditioning circuit in the second semiconductor die;
bonding the first and second dies to a common substrate; and,
forming electrical connections between the two dies to complete the first signal conditioning circuit from the first portion of the first signal conditioning circuit and the second portion of the first signal conditioning circuit.

19. A method according to claim 18, wherein the first semiconductor die comprises a first portion of a first signal path and the second semiconductor die comprises a second portion of the first signal path, the first signal path disposed between a first input port and a first output port.

20. A method according to claim 19, wherein the second semiconductor die comprises a second signal path that is other than the second portion of the first signal path and in approximate RF isolation therefrom.

21. A method according to claim 18, wherein the second semiconductor die is manufactured using a more expensive semiconductor process than that used for manufacturing of the first semiconductor die.

22. A method according to claim 18, wherein the first portion of the first signal conditioning circuit is more cost effectively implemented in the first semiconductor die.

23. A method according to claim 18, wherein the first semiconductor die does not facilitate implementation of the second portion of the first signal conditioning circuit therein.

24. A method according to claim 18, wherein implementing of the second portion of the first signal conditioning circuit within the second semiconductor die provides increased performance in signal conditioning as compared to implementing of the second portion of the first signal conditioning circuit within the first semiconductor die.

25. A method according to claim 18, wherein prior to implementing the first signal conditioning circuit comprises partitioning of the first signal conditioning circuit into the first portion and the second portion.

26. An electronic apparatus comprising:
a first integrated circuit semiconductor die comprising:
a first portion of a first signal conditioning circuit integrated within the first integrated circuit die and disposed along a first signal path;
a third portion of a first signal conditioning circuit integrated within the first integrated circuit die and disposed along the first signal path; and
a second integrated circuit semiconductor die comprising;
a second portion of the first signal conditioning circuit integrated within the second integrated circuit die and disposed along the first signal path for performing a first signal conditioning function along with the first and third portions of the first signal conditioning circuit for a signal propagating along the first signal path; and,
a substrate for supporting the first and second integrated circuit semiconductor dies and for providing electrical connection to and from the first and second integrated circuit semiconductor dies.

27. An electronic apparatus according to claim 26, comprising:
a first RF signal input port coupled with an input port of the first portion of the first signal conditioning circuit for receiving of a first RF input signal; and
a first RF signal output port coupled with an output port of the third portion of the first signal conditioning circuit for providing of a first RF output signal,
wherein the first signal path is disposed between the first RF signal input port and the first RF signal output port,
wherein the coupling circuit comprises;
a first electrical connection disposed between an output port the first portion of the first signal conditioning circuit and an input port of the second signal conditioning portion of the first signal conditioning circuit; and,
a second electrical connection disposed between an output port the second portion of the first signal conditioning circuit and an input port of the third signal conditioning portion of the first signal conditioning circuit.

28. An electronic apparatus according to claim 26, comprising:
a first RF signal input port coupled with an input port of the second portion of the first signal conditioning circuit for receiving of a first RF input signal; and
a first RF signal output port coupled with an output port of the third portion of the first signal conditioning circuit for providing of a first RF output signal,
wherein the first signal path is disposed between the first RF signal input port and the first RF signal output port,
wherein the coupling circuit comprises;
a second electrical connection disposed between an output port the second portion of the first signal conditioning circuit and an input port of the third signal conditioning portion of the first signal conditioning circuit.

29. An electronic apparatus according to claim 26, comprising a second signal conditioning circuit comprising a first portion of the second signal conditioning circuit and a second portion of the second signal conditioning circuit integrated within the second integrated circuit die for performing a second signal conditioning function on a signal propagating along a second signal path that is different than the first signal path.

30. An electronic apparatus according to claim 26, wherein the first integrated circuit die is derived from a first semiconductor wafer comprised of one of Si, SiGe, GaAs, InP, and GaN.

31. An electronic apparatus according to claim 30, wherein the second integrated circuit die is derived from a second semiconductor wafer that is comprised of the other one of Si, SiGe, GaAs, InP, and GaN.

32. An electronic apparatus according to claim 26, wherein the second portion of the first signal conditioning circuit comprises an interstage matching circuit.

33. An electronic apparatus according to claim 26, comprising a first ancillary circuit integrated within the first integrated circuit die and electrically coupled to the first portion and the third portion of the first signal conditioning circuit for use during operation thereof.

34. An electronic apparatus according to claim 33, comprising a second ancillary circuit integrated within the first integrated circuit semiconductor die and electrically coupled to the second portion of the first signal conditioning circuit for use during operation thereof.

* * * * *